US006631273B1

(12) United States Patent
Eswein et al.

(10) Patent No.: US 6,631,273 B1
(45) Date of Patent: Oct. 7, 2003

(54) METHOD AND APPARATUS FOR FILTER SELECTION FROM A FREQUENCY SYNTHESIZER DATA

(75) Inventors: Glenn William Eswein, San Diego, CA (US); Daniel James Curran, Summerfield, NC (US); Graham Stuart Hamilton, San Diego, CA (US); James Francis Reardon, San Diego, CA (US); John Francis O'Connor, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/392,825

(22) Filed: Jan. 31, 2000

(51) Int. Cl.$^7$ ............... H04Q 7/20; H04B 7/185; H04J 3/18; H03L 7/00; H01P 5/12
(52) U.S. Cl. ............... 455/462; 455/12.1; 370/477; 370/347; 327/162; 333/101; 341/118; 600/453; 708/300
(58) Field of Search .................. 455/73, 12.1, 462; 370/477, 347; 327/162; 333/101; 341/118; 600/453; 708/300; 348/21

(56) References Cited

U.S. PATENT DOCUMENTS

| | | | | |
|---|---|---|---|---|
| 4,586,174 A | * | 4/1986 | Wong ................. | 370/477 |
| 4,641,325 A | * | 2/1987 | Hughes ............... | 327/162 |
| 4,876,737 A | * | 10/1989 | Woodworth et al. ...... | 455/12.1 |
| 5,134,615 A | * | 7/1992 | Freeburg et al. ........ | 370/347 |
| 5,371,783 A | * | 12/1994 | Rose et al. ........... | 455/462 |
| 5,528,682 A | * | 6/1996 | Cotreay .............. | 333/101 |
| 5,647,366 A | * | 7/1997 | Weng ................. | 600/453 |
| 5,675,334 A | * | 10/1997 | McCartney ............ | 341/118 |
| 5,987,484 A | * | 11/1999 | Sherry et al. .......... | 708/300 |
| 6,052,158 A | * | 4/2000 | Nielsen ............... | 348/21 |

* cited by examiner

Primary Examiner—William Cumming
(74) Attorney, Agent, or Firm—Foley & Lardner

(57) ABSTRACT

Modern portable communications units, and in particular cellular telephones, can contain several frequency bands for receiving and several frequency bands for transmitting signals. Typically these units contain a baseband unit and a frequency synthesizer unit, which may be embodied as VLSI integrated circuits. The baseband unit commonly contains the user interfaces and control signals for controlling other portions of the circuitry. The second unit is sometimes called a frequency synthesizer unit. The second unit is dedicated to producing frequencies that are used by the communications system to create RF signals for broadcast and also to take RF signals and extract the modulated signal from them for decoding. As personal communications units have begun using an increasing number of bands it is often necessary to configure different filters to receive or broadcast the different bands. Typically, the baseband Integrated Circuit or separate circuitry does this filter configuration management. The data for filter switching, however, can be decoded from the data that is communicated across the serial bus to the frequency synthesizer integrated circuit. By allowing the frequency synthesizer Integrated Circuit to control the filtering as well as the frequency synthesizer functions, integrated circuit pins can be eliminated from the baseband integrated circuit. In addition, timing and latency problems involved with commanding the frequency change over a serial bus and switching filters directly are eliminated.

15 Claims, 12 Drawing Sheets

| TRANSMIT FREQUENCY SOURCE | FILTER USED | DATALINES | | |
|---|---|---|---|---|
| | | 605 | 607 | 649 |
| 611 | FILTER #641 | 1 | 0 | 0 |
| 613 | FILTER #641 | 1 | 0 | 1 |
| 615 | FILTER #643 | 0 | 1 | X |

| RECEIVE FREQUENCY SOURCE | FILTER USED | DATALINES | | |
|---|---|---|---|---|
| | | 637 | 635 | 651 |
| 625 | FILTER #647 | 1 | 0 | 0 |
| 627 | FILTER #647 | 1 | 0 | 1 |
| 629 | FILTER #645 | 0 | 1 | X |

FIG. 7

| TRANSMIT FREQUENCY SOURCE | FILTER USED | DATALINE 607 |
|---|---|---|
| 611 | FILTER #801 | 0 |
| 613 | FILTER #801 | 0 |
| 615 | FILTER #643 | 1 |

| RECEIVE FREQUENCY SOURCE | FILTER USED | DATALINE 635 |
|---|---|---|
| 625 | FILTER #803 | 0 |
| 627 | FILTER #803 | 0 |
| 629 | FILTER #645 | 1 |

FIG. 9

METHOD AND APPARATUS FOR FILTER SELECTION FROM A FREQUENCY SYNTHESIZER DATA

FIELD OF THE INVENTION

The present invention relates, generally, to systems, processes and devices which use frequency synthesizers and filters and, in particular embodiments, to processes, systems and devices in which the architecture of frequency synthesizing and filtering stages of communication transceivers is improved.

DESCRIPTION OF THE RELATED ART

Portable electronic devices have become part of many aspects of personal, business, and recreational activities and tasks. As the popularity of various personal communication devices, such as portable phones, portable televisions and personal pagers increases, the demand for smaller, lighter, more powerful, and more power efficient electronics, which comprises these devices, has also continued to increase.

The demand for smaller, lighter, more powerful, and more power efficient electronics provides motivation for ever increasing levels of circuit integration, in order to minimize the number of integrated circuits and improve the functioning of circuits which compose such systems. As the levels of integration increase and the actual number of integrated circuits within a system decrease, each integrated circuit may need to perform an increased portion of the functions of the overall system. Accordingly, the integration level of integrated circuits continues to increase as the number of integrated circuits within such systems continues to shrink. As more functions are integrated into fewer and fewer integrated circuit packages the number of pins on integrated circuits, i.e. input and output connections, has risen. As the levels of integration, of integrated circuits, increase, circuit packaging and input output pin count become critical design considerations.

Integrated circuits for communication systems must also be concerned with interoperability, that is integrated circuits from one manufacturer must be able to work with a variety of other manufacturers' integrated circuits. The more integrated circuits that a manufacturer's product is compatible with the more integrated circuits that that manufacturer may sell. Because of the desire for interoperability, various manufacturers often develop similar interfaces between different integrated circuits. The need for common interfaces is increasingly important as higher density integrated circuits integrate more functions. As more functions are integrated, there is a need for more input output connections to connect the ever-increasing number of functions, within an integrated circuit, to the outside world. To meet the increasing input/output needs of increasingly complex integrated circuits, manufacturers have turned to multiplexed input and output pins, serial and parallel busses to convey information between parts.

Some of the buses, such as the serial I²C bus, are standardized and well defined. Others may adopt similar physical connections, so that the interconnections between parts become de facto standards and only the data communicated is changed, depending on which manufacturer's devices are being used. One such de facto standard is the serial bus used by the baseband electronics in communications circuits to communicate with the synthesizer portion of the circuitry. The baseband portion of the communications system circuitry is a portion of the circuitry that is used for controlling the system. It commonly includes logic circuitry to control other subsystems, and may control the receiving and processing of commands from the user of the system as well as displays. The synthesizer portion of the circuitry is the portion that commonly controls the synthesis of frequencies for modulating and demodulating signals. Examples of frequency synthesizers controlled by serial busses are the MB15E07SL integrated circuit produced by Fujitsu, the LMX2326 produced by National Semiconductor, and the MC145202 produced by Motorola.

Commonly included with a baseband electronics section and a synthesizer electronics section is a filtering section. A filtering section is typically separate from a synthesizer portion of the circuitry and contains discrete filtering elements. If only one transmit band and one receive frequency band is used, within a communications unit, the associated bandpass filters used with those frequency bands may be hardwired into the circuit, as they would never need to be changed. More and more modern communications devices, however, are required to operate in several communications bands and have the ability to be switched between the bands. An example of a communication system being required to support more than one band is the Japanese Personal Digital Cellular System (PDC). An additional allocation of bandwidth for the Japanese Personal Digital Cellular (PDC) system has required handset radios to support communication channels in three separate receive and transmit frequency bands. Existing SAW (Surface Acoustic Wave) filters, such as the PDC800 produced by Fujitsu, which are commonly used in such applications, can be only used to support one or two of the bands at a time. Because the SAW filters can be used to support only one or two of the bands at a time methods for selecting correct filters for a given communication channel need to be devised.

It is common practice to have an embedded processor control such subsystems. The straightforward approach to solving the filter/band selection problem is to add, to the embedded processor subsystem, digital logic and control signals to switch bandpass filters. The control signals needed may be supplied to circuitry external to the embedded processor subsystem. Embodiments of the present disclosure dispense with the straightforward solution of adding digital logic and control signals to the embedded processor subsystem.

SUMMARY OF THE DISCLOSURE

Accordingly, preferred embodiments of the present invention are directed to frequency synthesis and filter selection circuitry, and systems employing the same. Embodiments described herein relate to methods and apparatus for improving control over the selection of bandpass filters, in systems where more than one filter is present. External circuitry can then direct signals through the appropriate filters. Embodiments of the present invention instead use the data which is used to program the frequency synthesizer circuits to control filter selection. By decoding the data from the signals used to program the frequency synthesizer, logic circuitry can determine which frequency is being synthesized, and hence which filter is required. By decoding the data used to program the frequency synthesizer and using it to control the selection of filters the need for additional logic and control signals to select filters can thereby be eliminated.

The elimination of additional control signals to select filters, results in a reduction of the number of connections between the filter selection circuits and the embedded processor subsystem. This reduction saves space, makes for easier circuit board layout, and reduces test time of the baseband processor Integrated Circuit by reducing the amount of I/O pins which must be tested. In addition, designs are simpler because software, logic circuits and other circuitry, which might have been required to drive the additional control circuits, are no longer needed.

An illustrative embodiment of the present invention includes apparatus for producing and detecting radio frequencies. This illustrative embodiment includes a first unit that generates serial bus data, and a serial bus, coupled to the first unit that receives the serial bus data that is provided to it. This illustrative embodiment also includes a second unit, coupled to the serial bus, for accepting the serial bus data and creating second unit control signals, from the serial bus data. A frequency signal generating mechanism is included within the second unit. The second unit has inputs for accepting control signals and generating a frequency signal based on those control signals. The second unit also activates one of the filters and deactivates the remaining filters.

BRIEF DESCRIPTION OF THE DRAWINGS

FIG. 7 is a chart showing the relationship of the data lines logic values to the frequency of the synthesizer and to the filter used.

FIG. 9 is a chart showing the relationship of data line value to the synthesizer frequency and bandpass filter selected, for example, in the embodiment depicted in FIG. 8.

DETAILED DESCRIPTION OF PREFERRED EMBODIMENTS

In the following description of preferred embodiments, reference is made to the accompanying drawings, which form a part thereof, and in which is shown, by way of illustration, specific embodiments in which the invention may be practiced. It should be understood that other embodiments may be utilized and structural changes may be made without departing from the scope of the present disclosure.

In addition, the present disclosure is illustrated by use of examples referenced to portable communication unit such as a portable phone. It is to be understood that, although the present invention is useful in the portable telephone art, the present invention is applicable to a variety of systems that employ frequency synthesis and filtering mechanisms. Illustrative embodiments presented are by way of example and are not to be construed as limiting the usefulness or applicability of the present invention.

To realize a cost-efficient design, portable telephone manufacturers may attempt to minimize size, weight, complexity, and power consumption. Embodiments of the present invention therefore relate to portable communication transceivers in which bandpass filters may be switched using frequency synthesizer data. It should be noted, however, that frequency synthesizers and filtering stages that accompany them, according to embodiments of the present invention, are not unique to portable communications. Frequency synthesizers and filtering stages may be employed in a variety of electronics, including both wireless transmission systems as well as wired systems. For purposes of simplifying the present disclosure, however, preferred embodiments of the present invention are described in relation to personal wireless communications systems, including, but not limited to digital mobile telephones, digital cordless telephones and the like. Such personal communications systems typically include one or more portable receiver/transmitter units.

Figure 1:
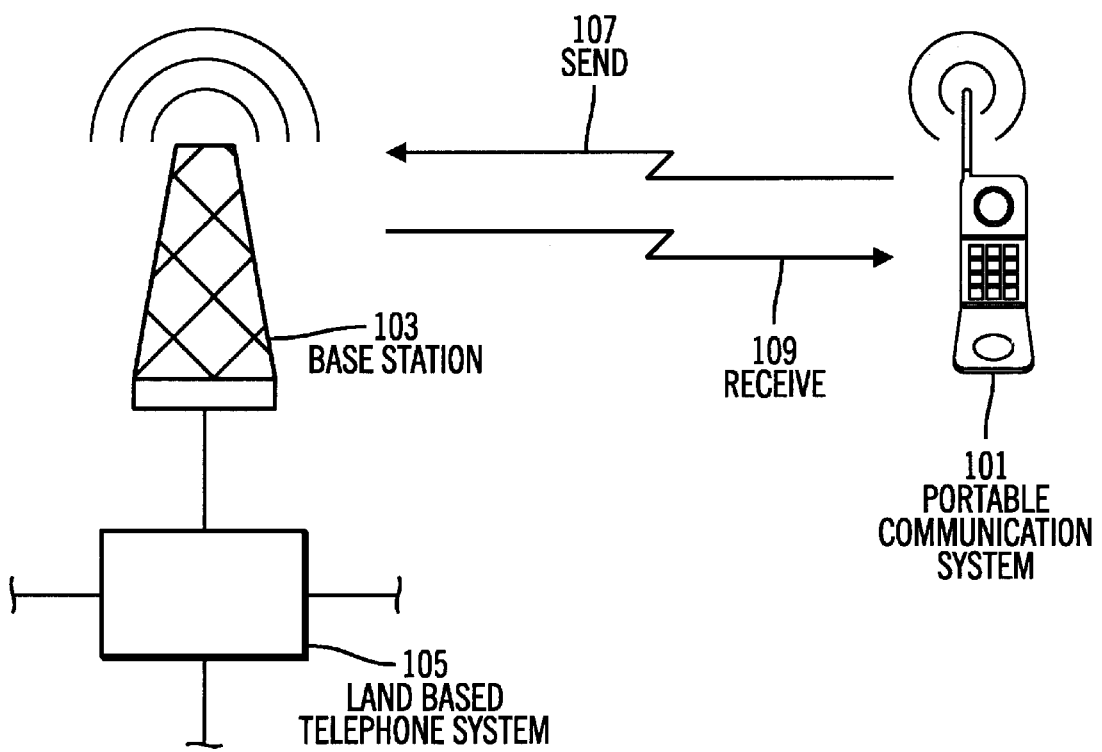
FIG. 1 is a block diagram representing a system environment according to an example embodiment of the present invention.

A generalized representation of a system environment, according to an embodiment of the present invention, is shown in FIG. 1. In FIG. 1 a portable communications system 101 communicates with a base station receiving and broadcast unit 103. The portable communications system 101, communicates with the base station 103, receiving information across a communications channel 109 and sending information across a second communications channel 107. The receive and send channels, 107 and 109, may be the same channel, different channels or even channels which change with time. The base station 103 couples the communications of the portable communications system 101 into a node 105, which is an access point into the land based phone system. Portable communications system 101, includes both transmit and receive sections as generally illustrated in FIG. 2.

Figure 2:
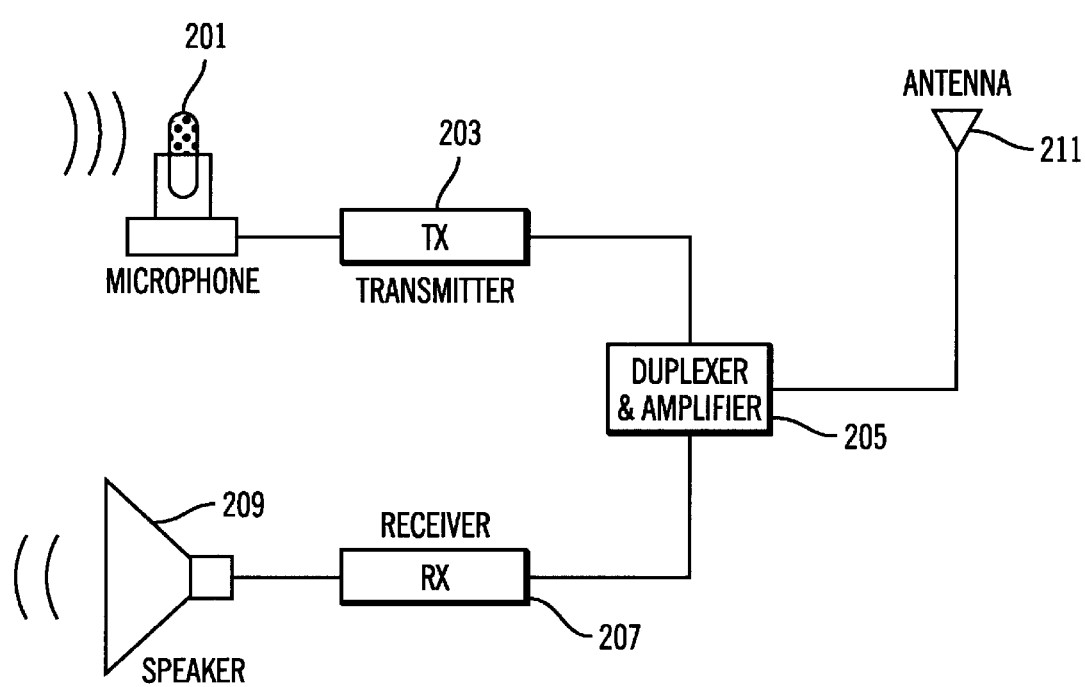
FIG. 2 is a more detailed block diagram representation of transmit and receive functions as may be found in the exemplary portable communication system in FIG. 1.

FIG. 2 represents, in detail, transmit and the receive functions as may be found in a portable communication system, such as, for example, the portable communications system 101. In the present illustrative embodiment, the signal source may include, for example, a microphone 201 for converting sound waves into electronic signals representative of the sound waves. The electronic signals representative of the sound waves are then coupled to a transmitter 203. The transmitter unit 203 receives, from the microphone 201, the electronic signals, which represents the sound waves, and modulates a carrier signal with a representation of them. The transmitter, 203, amplifies the modulated signal and otherwise prepares the electronic signals, for transmission. The signals, which have been prepared for transmission, are provided to a duplexer 205, which then further couples the signals into an antenna 211, for the purpose of broadcasting the signal via radio transmission. In other embodiments, the signal source may include any suitable device for producing data signals for communication over channel 107 such as, but not limited to, a keyboard, a digital voice encoder, a mouse or other user input device, a sensor, monitor, testing apparatus, or the like.

A portable communication system 101 may also include a receiving antenna 211 for the reception of signals. In the portion of the example portable communication system shown in FIG. 2 the antenna 211 is coupled to a duplexer 205, which then provides the received signals to the receiver unit 207. The receiver unit 207 demodulates, amplifies and otherwise processes the received signal and provides it to a speaker 209. The speaker transforms provided signal into sound waves, which may then be perceived by a user. In other embodiments the signal received may represent other information other than voice, such as, but not limited to data input to a computer, remote telemetry, fax data, or the like.

Figure 3:
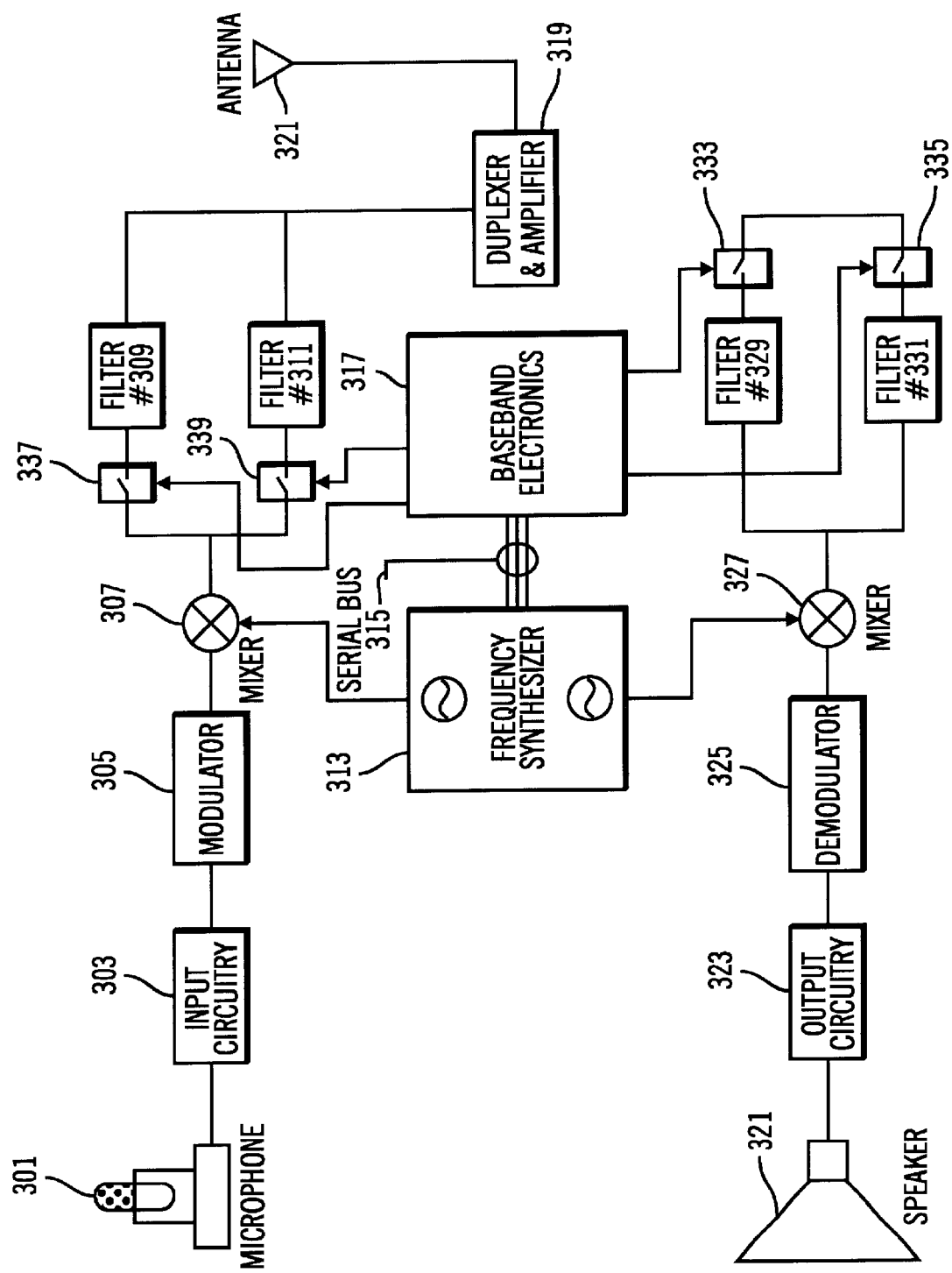
FIG. 3 is block diagrams representing a system interconnect arrangement, such as may be found in a portable telephone containing two transmit and two receive filters.

FIG. 3 is a detailed block diagram of the illustrative portable communications system, of FIG. 2. For illustration purposes, it may be assumed that the portable communications system, is a Japanese Personal Digital Cellular (PDC) telephone. This example is chosen because it will be particularly illustrative, as a real world example, when describing the disclosure herein. Those skilled in the art will recognize that the disclosure, while useful in this application, is not limited to this application, and that the disclosure may be applied in a variety of different systems in a variety of different ways. A microphone 301, is used to accept the user's voice and convert it into an electrical signal, representative of the user's voice. The electrical signal representing the user's voice is then provided to the input circuitry 303, where it is amplified and digitized. The digitized voice signal is then provided to a modulator 305 where it is used to modulate a carrier signal. The modulated signal is then provided to a mixer 307, where it is mixed with a signal provided to the mixer 307 by a frequency synthesizer unit 313. The mixer 307 translates the frequency of the modulated signal to the proper frequency for broadcast. The broadcast signal is then provided to either filter 309 or filter 311 as controlled by the baseband electronics 317. The baseband electronics uses solid state switch 337, or solid state switch 339 to select which filter the broadcast signal will be coupled to. The selected filter then attenuates any undesired frequency components, and passes the desired components. The filtered transmission signal is then coupled into the amplifier and duplexer block 319, where it is amplified, by the amplifier, and coupled, via the duplexer, into antenna 321, for broadcast via radio transmission.

In the present embodiment two filters, a first filter 309 and a second filter 311, are present. These filters commonly may be SAW (Surface Acoustic Wave) filters, which are very effective in this type of application. Current SAW filters do have a limitation, however, that they can filter only frequency bands that are about 5% of their nominal center frequencies. For this reason there are two filters, i.e. to cover the necessary frequency bands. Japanese Personal Digital Cellular (PDC) telephones, as illustrated in the present embodiment, utilize three separate frequency bands to transmit and to receive signals. Because one SAW filter can only cover two of the bands, a second filter is needed. The filters are then commonly switched as the broadcast frequency is changed. A straightforward approach to the switching of filters is to allow a baseband electronics unit, such as 317, to control the switching of the filters as just described. The baseband electronics unit may typically be the overall controller for the telephone. The baseband electronics unit may commonly accept input commands from the user and then control the other subsystems within the telephone.

The serial bus 315 interconnection, for controlling the frequency synthesizer, has become somewhat of a de-facto standard in the industry, typically containing data, clock, and latch enable lines. The serial bus 315, couples programming data to the frequency synthesizer 313, so that the frequency synthesizer, 313 synthesizes and delivers the correct frequency to the mixer 307, thereby assuring that the proper frequency band for broadcast is chosen.

The signal received by the antenna 321 is coupled into the duplexer and Amplifier block 319. The received and amplified signal is then coupled into either filter 329, or filter 331, depending on which frequency band is being received. The frequency band being received, and hence the selection of filter 329 or filter 331, is commonly controlled by a baseband electronics unit in a manner similar to the selection of the selection of filter 309 or filter 311, in the broadcast portion of the system. The baseband electronics uses solid state switch 333, or solid state switch 335 to select which filter the received signal will be coupled to. The serial bus can be used to control the frequency synthesizer 313 for the receive side of the phone. The frequency synthesizer 313, provides the correct frequency to the receive mixer 327, to translate the received signal to the correct frequency for the demodulator 325. The demodulator 325 demodulates the signal received and couples it to the output circuitry 323. The output circuitry then processes the demodulated signal suitably for presentation to the speaker 321, where the original voice signal is reproduced for perception by the user.

It will be apparent to those skilled in the art that the foregoing description is one of example only. There are many modifications and variations of ways to interconnect the circuitry to implement the electronic functions illustratively described, and still preserve the essential functioning of the personal communications unit.

Figure 4:
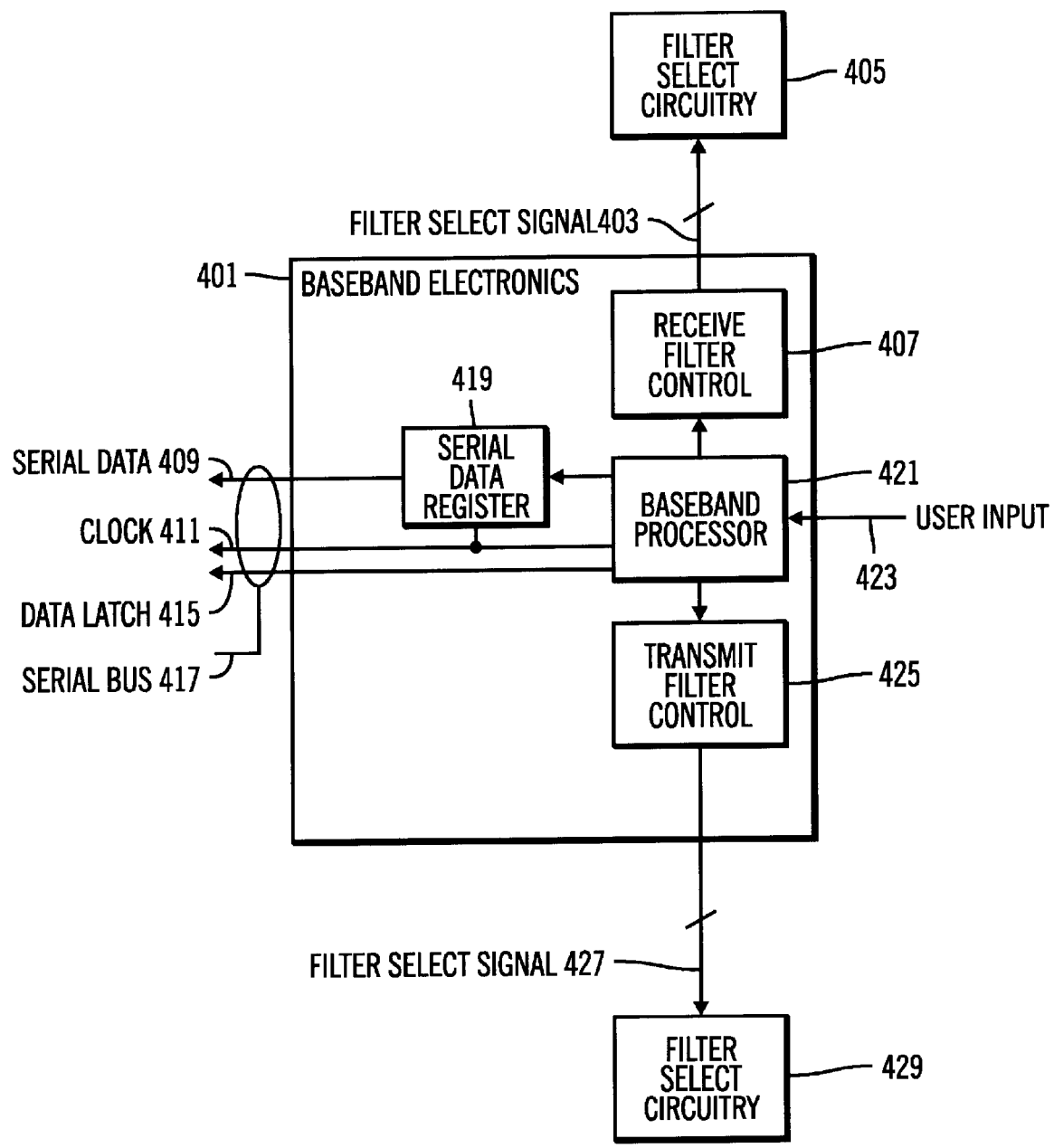
FIG. 4 is an enhanced detail block diagram of a Base Band Electronics unit, such as the unit shown in block 317 of FIG. 3.

FIG. 4 is a block diagram illustrating, with increased detail, the functioning of the baseband electronics unit 317. FIG. 4 illustrates an approach to controlling the frequency synthesizer and selecting bandpass filters. In FIG. 4 a baseband electronics unit 401, may be typically contained within one integrated circuit package. A baseband processor 421, is the controller for the baseband electronics unit 401. The baseband processor 421, receives user input 423 in the form of keystroke commands. The baseband processor 421, may also prompt the user with audio and visual cues (not shown). The baseband processor 421, processes the user input 423, and controls the baseband unit 401, to select the correct sending and receiving bands, initiate a call, and control the other functions within the phone.

The baseband processor 421, provides a signal to a receive filter control unit 407, for selecting the appropriate filter to match the broadcast band that has been chosen. The receive filter control unit 407 accepts the signal from the baseband processor 421 and stores the filter selection in a register that provides a filter select signal 403. The filter select signal 403 signal controls filter select circuitry 405, which activates the appropriate filter. Filter circuitry may be embodied in solid state switch circuits, for example, 333 and 335.

The baseband processor 421, also provides a signal to the transmit filter control unit 425, for selecting the appropriate filter to match the transmit band that has been chosen. The transmit filter control unit 425 accepts the signal from the baseband processor 421 and then stores the filter selection in an output register that provides a filter select signal 427. The filter select signal 427 controls filter select circuitry 429 that then activates the appropriate filter. Filter circuitry may be embodied in solid state switch circuits, for example, 337 and 339.

The baseband processor 421, also interfaces with the serial data register 419. The serial data register 419 receives the data, necessary to program the frequency synthesizer unit 313, from the baseband processor 421. This data may vary depending on the manufacturer of the frequency synthesizer unit 313, because, although the serial bus connections may be standardized between manufacturers, the data used to program the units can be different. The data necessary to program the frequency synthesizer unit is then coupled through the serial data line 409, to the frequency synthesizer unit 313. The serial data transfer from the baseband electronics unit 401, to the frequency synthesizer 501, is synchronized by the clock 411, which is provided by the baseband processor 421. The baseband processor also provides the data latch signal 413. The data latch signal 413, is coupled to the frequency synthesizer unit 501, and signals the frequency synthesizer unit 501, when the serial data 409, is valid.

Figure 5:
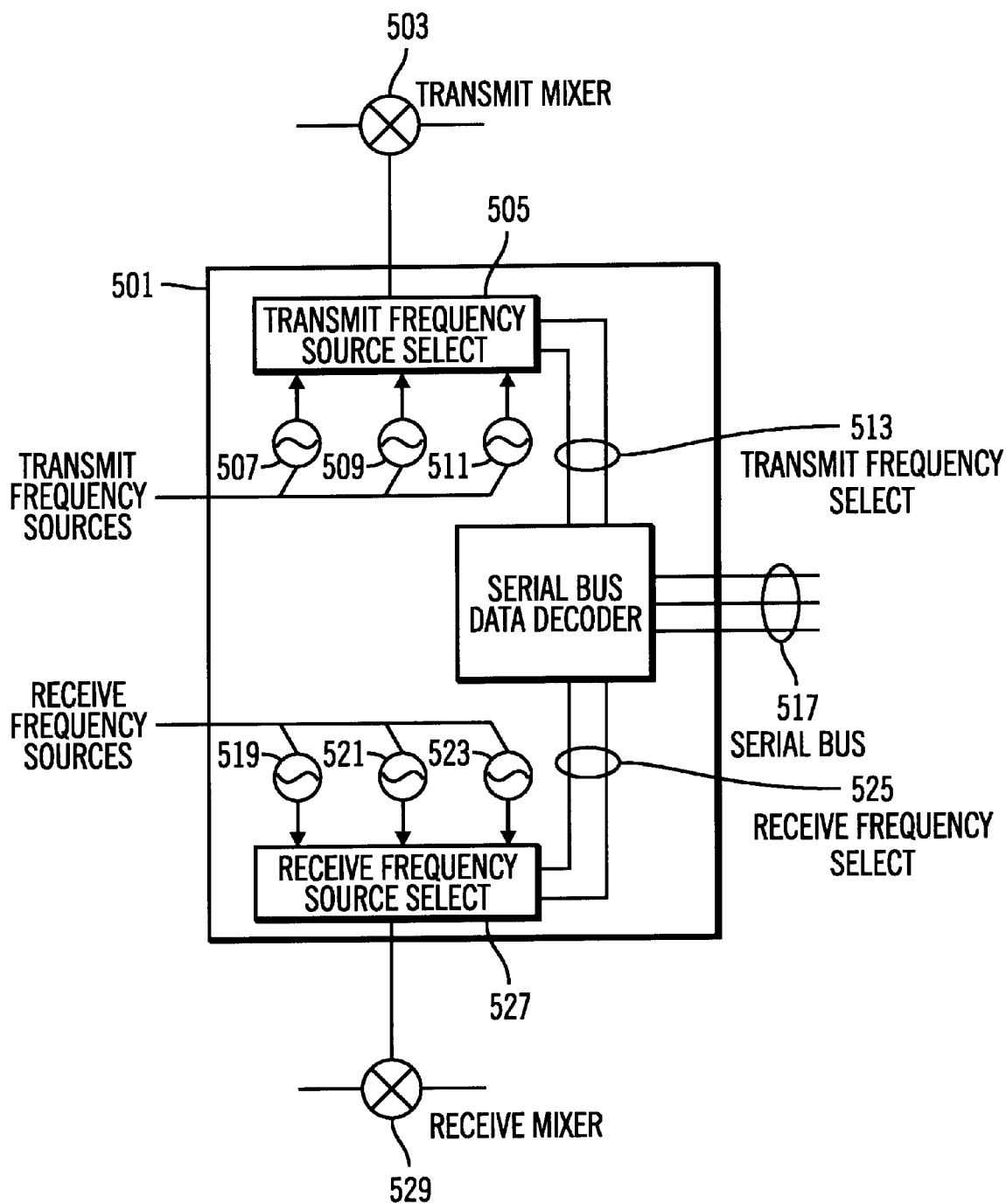
FIG. 5 is a functional block diagram of a frequency synthesizer, such as the frequency synthesizer shown in block 313 of FIG. 3.

FIG. 5 is a block diagram illustrating the functioning of a frequency synthesizer unit 501. A serial bus 517, is coupled to a serial bus data decoder 515. The serial bus data decoder 515, accepts and decodes the serial data provided to it by a baseband electronics unit 401, by means of the serial bus 517.

The serial bus data decoder 515, decodes information indicating which frequency must be provided to the transmit mixer, 503. The decoded serial bus information is coupled to the transmit frequency source select block 505, using the Transmit frequency select lines 513. The transmit frequency source select block 505 then selects the proper frequency, as indicated by the data from the serial bus data decoder 515, from one of the three transmit frequency sources, 507, 509 and 511. The selected transmit frequency source is then coupled into the transmit mixer 503, where it is used to mix with the modulated signal and provide the correct frequency for broadcast.

The serial bus data decoder 515, also decodes information indicating which frequency must be provided to the receive mixer 529. The decoded serial bus information is coupled to the receive frequency source select block 527, using the receive frequency select lines 525. The receive frequency source select block 527 then selects the proper frequency, as indicated by the data from the serial bus data decoder 515, from one of the three receive frequency sources 519, 521 and 523. The selected receive frequency source is then coupled into the receive mixer 529 where it is used to mix with the modulated signal and provide the correct frequency for broadcast.

Thus the baseband electronics unit 401 selects the frequencies that the portable communications system, illustratively the PDC phone, will use to broadcast and receive. The baseband electronics unit 401, may then select the proper filters to be used with the transmit and receive frequencies chosen. The broadcast and receive bandpass filter select signals 403 and 427 are used to control the receive and broadcast filter selection, as appropriate. The baseband electronics unit 401 also couples the information concerning which frequencies will be used to transmit and receive to the serial bus 417, for further coupling to the frequency synthesizer unit 501. The frequency synthesizer unit 501, accepts the data from the serial bus 517, and decodes it to ascertain which frequency source will be provided to the receive mixer 529 and which will be provided to the transmit mixer 503.

It will be recognized by those skilled in the arts that the foregoing description is used for illustrative purposes only and that various implementations can vary considerably from the one described. For example, the frequency of the signal provided to the transmit mixer is shown as being selected from three discrete frequency sources by a frequency source select block 505. In an actual implementation, there may not be three discrete frequency sources present. Because of cost considerations it is likely the three different frequencies will be generated by a single source, this is multiplied or divided as appropriate. Dividers may generate the frequencies, as may phase lock loops, multipliers, crystals, or other devices using schemes well known in the art. The three transmit frequency sources 507, 509, and 511 and the three receive frequency sources 519, 521, and 523, are used illustratively, in order to provide an understanding of the functioning of the circuit.

Figure 6A:
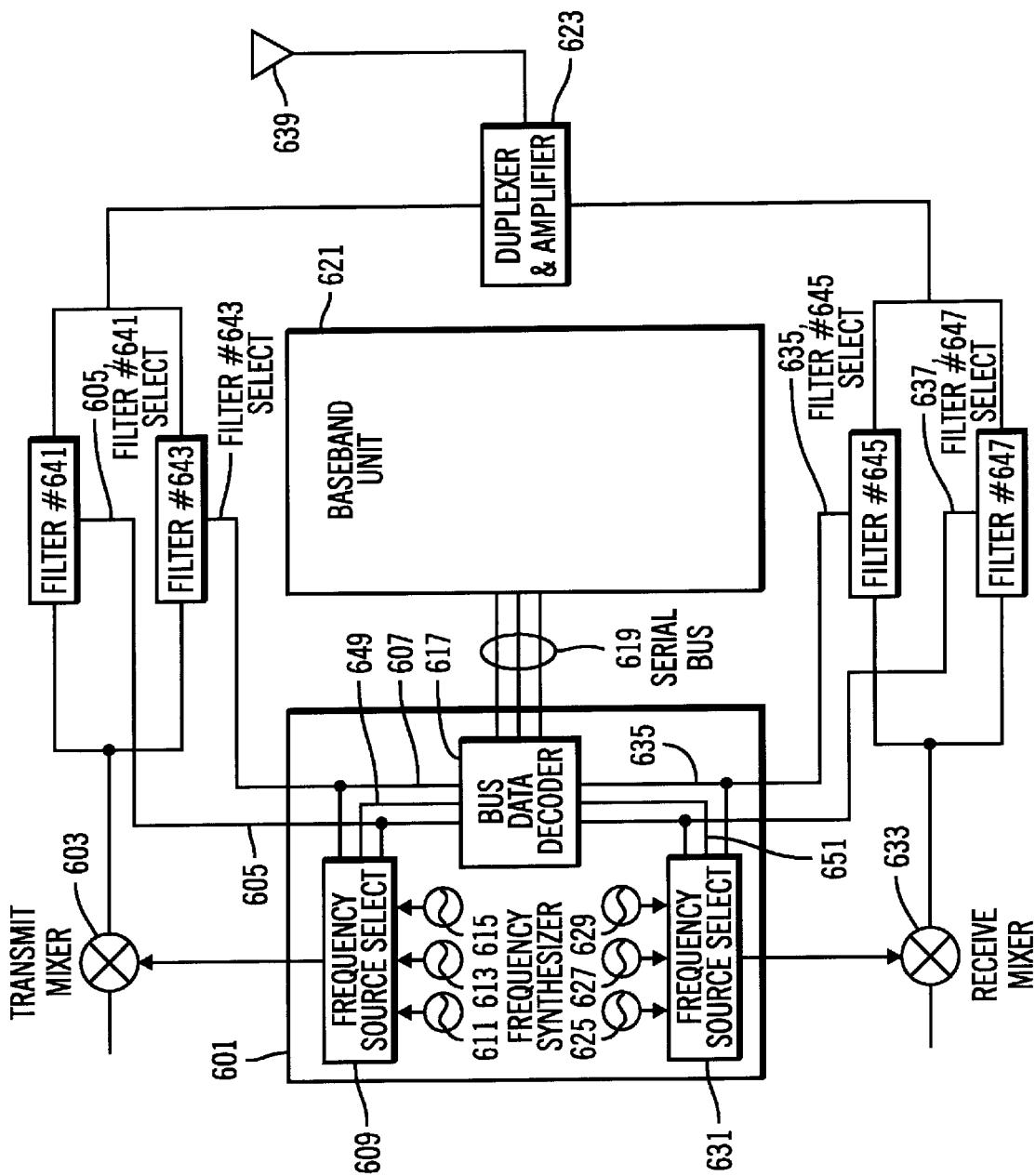
FIG. 6a is a block diagram of a preferred embodiment of the invention.
Figure 6B:
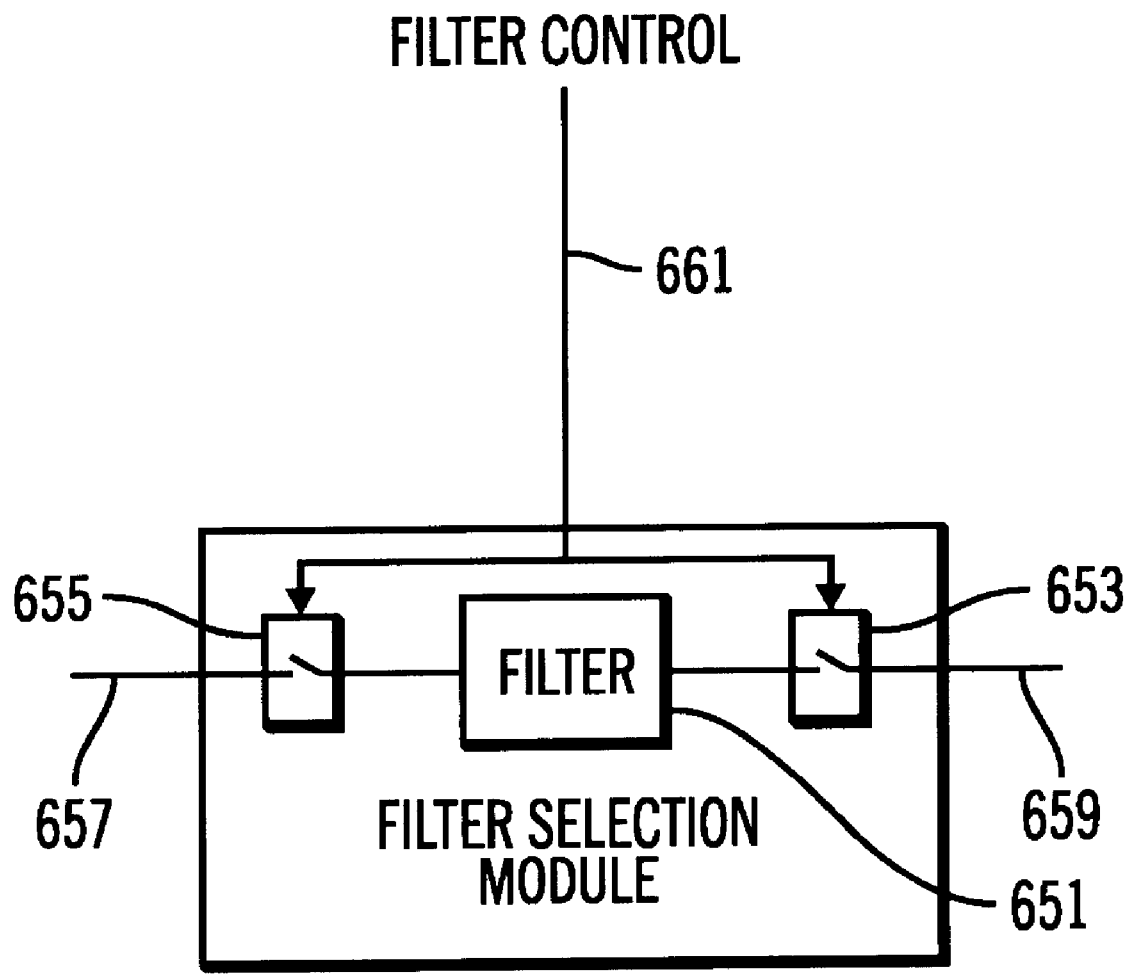
FIG. 6b is block diagram of an exemplary filter selection mechanism, according to an embodiment of the invention.

FIG. 6a is an exemplary functional block diagram, of a preferred embodiment, of the invention. In FIG. 6a, the baseband unit 621 is coupled via a serial bus 619 to the bus data decoder 617 The bus data decoder 617, is coupled to the transmit frequency source select 609 via data lines 605, 607 and 649. The data lines 605, 607 and 649, control the selection of frequency, which is provided to the transmit mixer 603, according to the Frequency-Filter Select Table shown in FIG. 7. If the transmit frequency source to be selected is 611, filter 641 will be activated and data values lines 605, 607, and 649 will have data values "1", "0", "0" coupled to their respective lines from the bus data decoder 617. If the transmit frequency to be selected is 613, filter 641 will again be activated and data lines 605, 607, and 649 will again have data values "1", "0", "1" coupled to the respective lines from the bus data decoder 617. If the transmit frequency to be selected is 615, filter 643 will be activated and data lines 605, 607, and 649 will have data "0", "1", "X" ("X"=don't care state, i.e. either a "1" or a "0") coupled to their respective lines from the bus data decoder, 617. Typically filters may not have activate inputs to turn them on and off. If they do not an alternative common approach is illustrated in FIG. 6b. FIG. 6b is block diagram of an exemplary filter selection mechanism, according to an aspect of the invention. In order to select filter 651, a control signal is applied to solid state switches 655 and 653 using filter control 661. When solid state switches 655 and 653 are activated the filter 651 is coupled to the input 657 and output 659 of the filter selection module and the filter 651 is activated. When solid state switches 655 and 653 are deactivated the filter 651 is decoupled from the input 657 and output 659 of the filter selection module and the filter 651 is deactivated.

Similarly the bus data decoder 617 is coupled to the receive frequency source select 631 via data lines 637, 635 and 651. These three data lines 637, 635 and 651, control the selection of frequency, which is provided to the receive mixer 633, according to the Frequency-Filter Select Table shown in FIG. 7. If the receive frequency to be selected is 625, filter 647 will be activated and data lines 637, 635 and 651 will have data logic levels "1", "0", "0" coupled to their respective lines from the bus data decoder, 617. If the receive frequency to be selected is 627, filter 647, will again be activated and data lines 637, 635 and 651 will have data logic levels "1", "0", "1" coupled to the irrespective lines from the bus data decoder, 617. If the transmit frequency to be selected is 629, filter 645 will be activated and data lines 637, 635 and 651 will have data logic levels "0", "1", "X" ("X"=don't care state, i.e. either a 1 or a 0) coupled to their respective lines, from the bus data decoder 617.

The receive and transmit signals, so selected, are coupled to the duplexer and amplifier 623, and thereby to the antenna 639 in the same manner as the FIG. 3, current art embodiment.

In the current embodiment of the disclosure, as shown in FIG. 6a, the baseband unit 621, does not contain the filter select signals as the approach illustrated in FIG. 3, does. Instead of controlling the filter select from the baseband unit 621, that function is relegated to the frequency synthesizer unit 601. This arrangement provides several advantages to the designer who is attempting to design and integrate a baseband unit with a frequency synthesizer unit into a complete system. The first of the advantages is that it saves four integrated circuit pins in a baseband integrated circuit, as compared to a conventional baseband design. The pins saved are dedicated pins, that must be maintained at a logic level at all times to properly select the filters which will be used. If the pins are not dedicated pins, i.e. are pins on which the data is valid for only certain time periods, then another data valid pin would need to be added to ensure that only valid data on the lines are used to select the filters to be used.

The reduction in Baseband unit pins provides several advantages. It enables the baseband unit pins, which are saved, to be used for other purposes, thereby increasing the functionality that can be contained within the baseband integrated circuit and communicated to the outside world. Another advantage is that it eliminates the testing of those pins so it can shorten the time for the testing of the baseband integrated circuit. A further advantage is that the filter control signals from the baseband integrated circuit are no longer needed, and the circuitry and circuit board layout may be simplified. In addition there is the advantage that the filter control signals and the frequency synthesis function are now within one integrated circuit (the frequency synthesizer) instead of being contained partly in the baseband integrated circuit and partially within the frequency synthesizer circuit. Combining both related control functions within the same circuit eliminates the timing problems, which can occur if the selection of the frequency to the mixer and the filter selection are not accomplished simultaneously. Commonly the filters are selected directly from circuitry within the baseband electronics portion of the circuit, or from added control circuitry. The frequencies coupled to the mixer circuits would, however, be selected as a consequence of information delivered via the serial bus. Receiving and decoding serial bus information and then coupling the correct frequency into the mixers takes time. If the selection of the filters and the coupling of the proper frequency into the mixer are not simultaneous, interference or noise may result, degrading the perceived quality of the unit. The selection of the filters and the coupling of the proper frequency into the mixer can be timed to coincide. Frequency synthesizer integrated circuits from different manufacturers, however, may perform the frequency synthesis function differently, producing different latencies between the coupling of the data to the serial bus and in the production of the frequencies to be coupled into the mixers. By consolidating the functions of selecting the filters and the coupling of the proper frequency into the mixer within one integrated circuit, the selection of the filters and the coupling of the proper frequency into the mixer can be easily synchronized, thus eliminating timing problems. Placing the control of the selection of the filters and the coupling of the proper frequency into the mixer within the frequency synthesizer integrated circuit, also creates the possibility of bringing the mixer and filtering functions into the frequency synthesizer integrated circuit.

Figure 8:
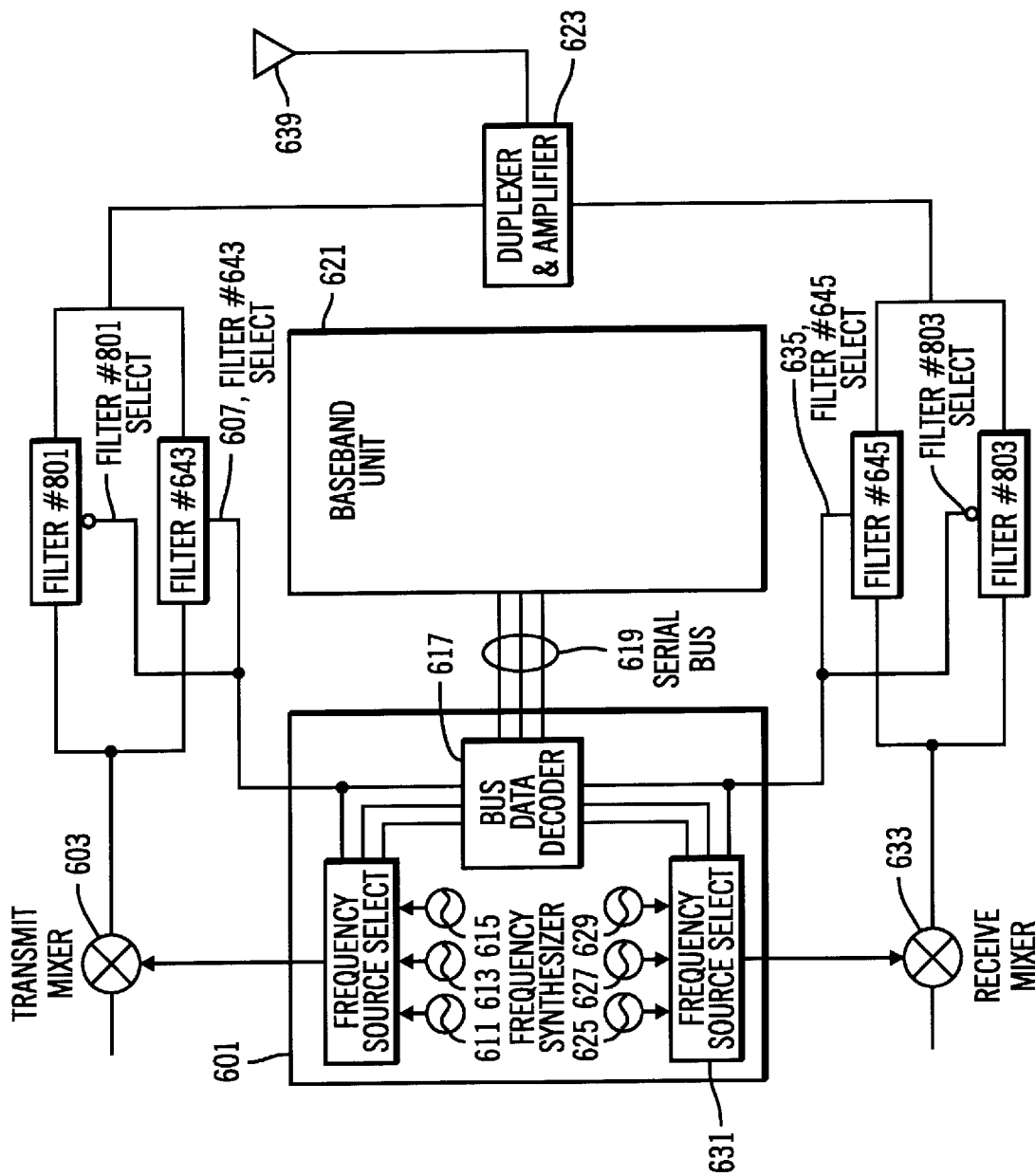
FIG. 8 is a block diagram of a preferred embodiment of the invention.

FIG. 8 is a block diagram of a second preferred embodiment of the disclosure. The second preferred embodiment of the disclosure is similar to the first preferred embodiment, illustrated in FIG. 6a. In both the first and second embodiments, the filter select function has been moved out of the baseband Unit 621 and into the frequency synthesizer unit 601. Filter 641, of FIG. 6a has been replaced by filter 801, of FIG. 8. Filter 801, is of a type that is activated by a logic "0" instead of a logic "1". filter 801, of FIG. 8 is activated by a logic "0" on data line 605, and Filter 643, of FIG. 8 is activated by a logic "1" on data line 605. In other words when filter 801, is activated Filter 643, is deactivated. Similarly, filter 647, of FIG. 6a has been replaced by Filter 803, of FIG. 8. Filter 803, of FIG. 8 is similar to filter 801, in that filter 803, is of a type that is activated by a logic "0" instead of a logic "1". Filter 803, of FIG. 8 is activated by a logic "0" on data line 637, and filter 645, of FIG. 8 is activated by a logic "1" on data line 635. In other words when filter 645, is activated filter 803 is deactivated. This situation is summarized in the table of FIG. 9. If the transmit frequency source of 611 or 613 is to be activated then data line 607 will have a logic "0" value coupled to it which will activate filter 801, and deactivate filter 643. If the transmit frequency source of 615 is to be activated, then data line 607 will be a logic "1" that will deactivate filter 801, and activate filter 643. Similarly if the transmit frequency source of 625 or 627 is to be activated then data line 635 will have a logic "0" coupled to it which will activate filter 803, and deactivate filter 645. If the transmit frequency source of 629 is to be activated then data line 635 will have a logic "1" coupled to it which will deactivate filter 803 and activate filter 645. By choosing filters with complimentary activation inputs and correctly coding the bus data decoder data lines, the bandpass filters for transmit and receive can be selected with a single external pin for the transmit stage and a single external pin for the receive stage.

Figure 10:
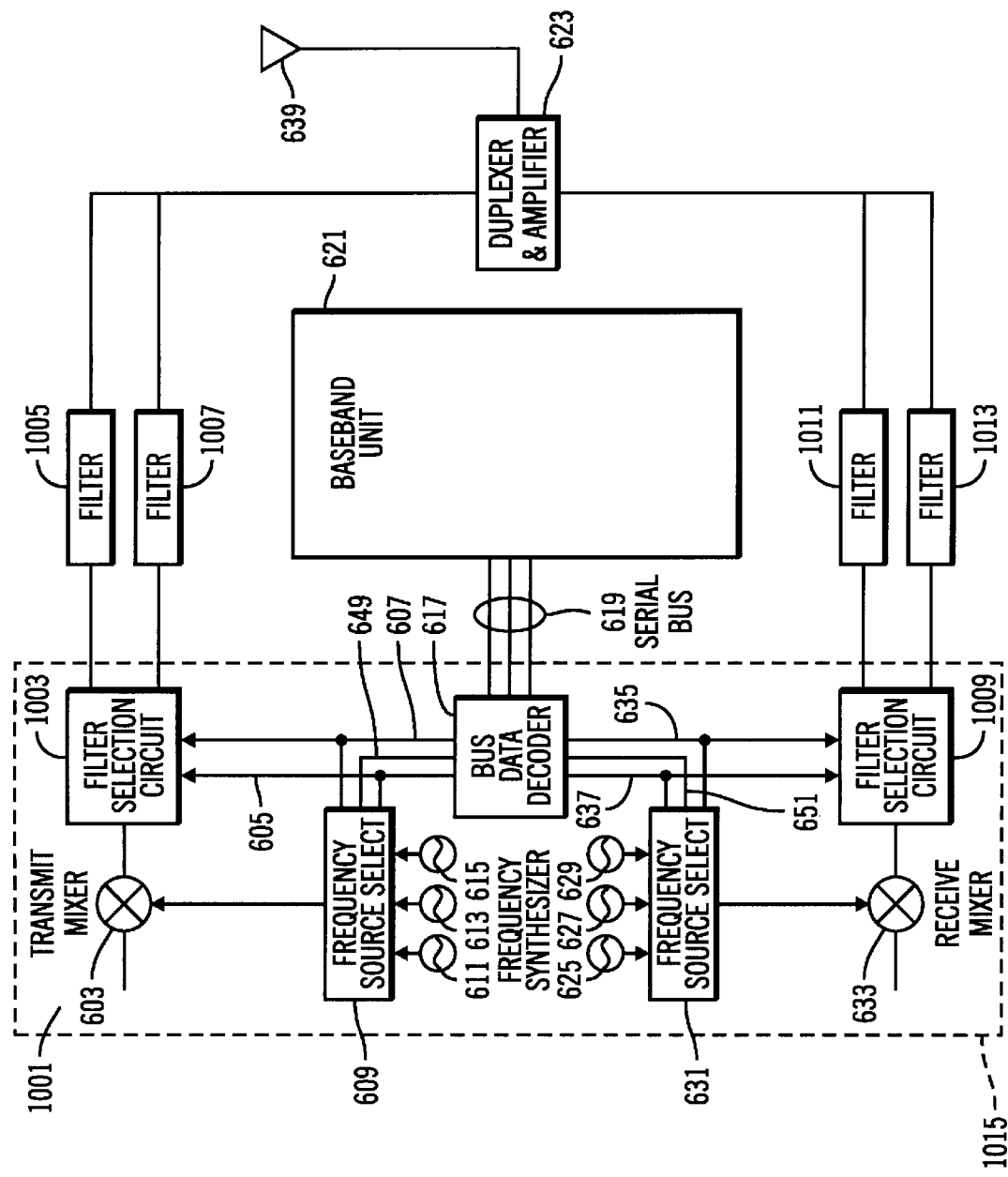
FIG. 10 is a block diagram of an embodiment of the invention incorporating the filter selection circuits and mixers into the frequency synthesizer unit.

In a third preferred embodiment in FIG. 10 the mixers and the filter selection circuits are combined into one integrated circuit 1001. The integrated circuit components are identified as being within the dotted line of the illustration in FIG. 10. This embodiment conserves IC pins over a prior art embodiment in which the filter selection is controlled by separate circuitry. In other words, by selecting the transmit and receive filters by using the frequency synthesizer data, control lines to the filters from the baseband unit 621 can be avoided. This can allow the transmit mixer 603, receive mixer 633, as well as filter selection circuits 1003 and 1009 to be integrated into one package as shown by 1015.

Figure 11:
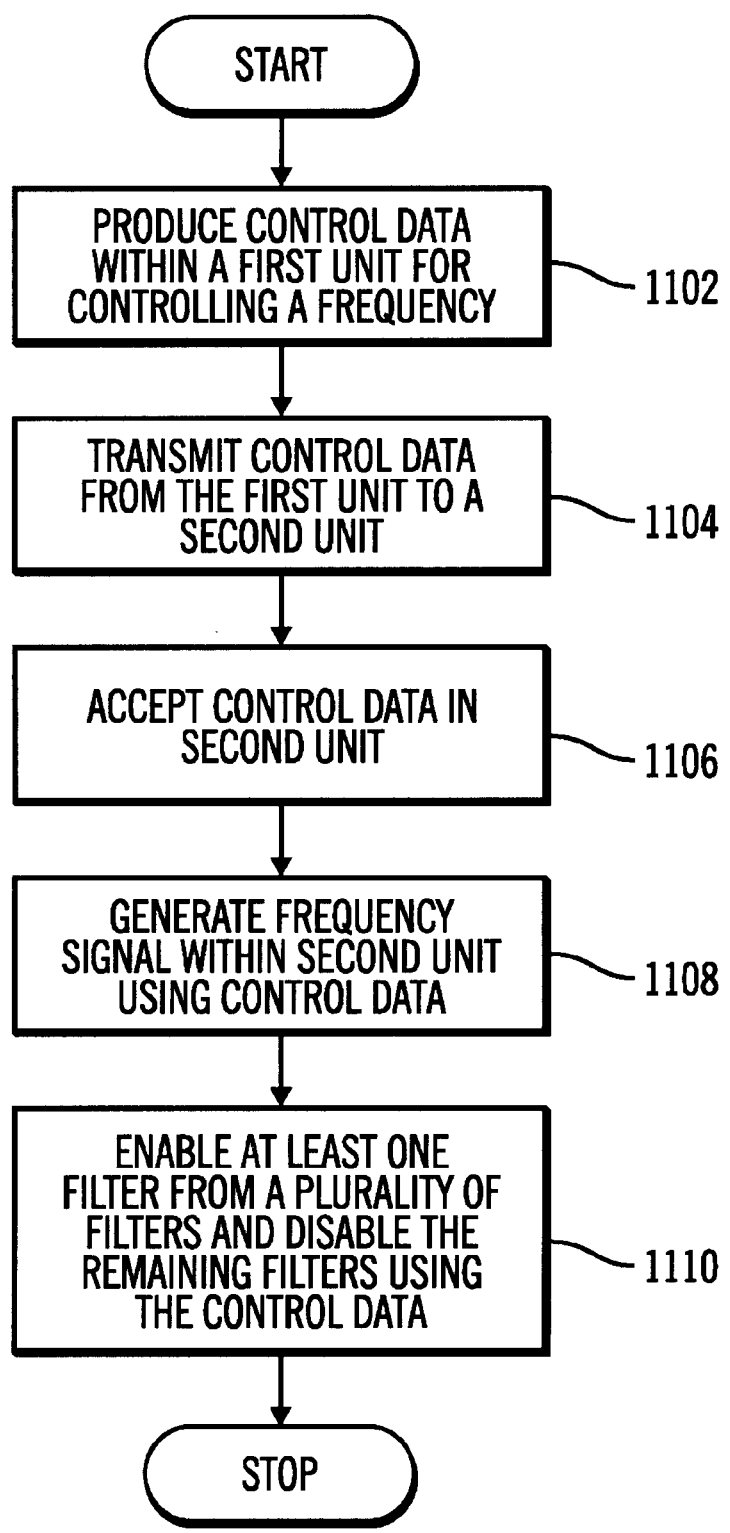
FIG. 11 is a flowchart showing a method for controlling filter selection, according to an embodiment of the invention.

A method for controlling filter selection is illustrated in the flowchart shown in FIG. 11. In one embodiment of the method shown in FIG. 11, controlling filter selection comprises producing control data in a first unit, as shown at 1102. The control data is then transmitted from the first unit to a second unit, as shown at 1104. The control data is then accepted by the second unit, as shown at 1106. In one embodiment, the first unit may be a baseband unit of a portable communication unit, and the second unit may comprise a frequency synthesizer. In one embodiment, the first unit may be coupled to a serial bus that receives control data as serial bus data that is provided to it. The second unit may also be coupled to the serial bus, for accepting the control data as serial bus data.

A frequency signal is then generated within the second unit using control data, as shown at 1108. In one embodiment, the frequency is generated by a frequency synthesizer within the second unit. In one embodiment, the control data is also used to enable at least one filter from a plurality of filters and disable the remaining filters using the control data, as shown at 1110.

Those skilled in the art will recognize that the techniques of this disclosure may be extended and modified to meet the needs of particular implementations, without departing from the spirit and the substance of the disclosure. Those skilled in the art will also recognize that the illustrative implementations in the disclosure serve as explanation only, and not as limits to the invention, which is defined by the claims appended below.

We claim:

1. An apparatus for controlling a filter selection circuit, the apparatus comprising:
    a first unit for generating control data;
    a data bus coupled to the first unit for receiving the control data;
    a second unit, coupled to the data bus, for accepting the control data and creating second unit control signals from the control data;
    a frequency generating mechanism within the second unit, for accepting second unit control signals and generating a frequency signal based on the second unit control signals; and
    a filter selection circuit for selectively activating at least one of a plurality of filters for filtering said frequency signal based on the second unit control signals.

2. An apparatus as in claim 1 wherein the data bus further comprises a serial bus.

3. An apparatus as in claim 1 wherein the first unit further comprises:
    an input for accepting frequency generating commands; and
    a circuit for converting the frequency generating commands into control data.

4. An apparatus as in claim 1, wherein the first unit is contained within an integrated circuit.

5. An apparatus as in claim 1, wherein the second unit is contained within an integrated circuit.

6. An apparatus as in claim 1 wherein:
    the first unit is contained within a first integrated circuit;
    the second unit is contained within a second integrated circuit; and
    the data bus connects the first unit to the second unit.

7. An apparatus as in claim 6 wherein the data bus is a serial bus.

8. An apparatus as in claim 1 wherein the first unit is a baseband unit of a communications unit.

9. An apparatus as in claim 1 wherein the second unit is a frequency synthesizer unit of a communications unit.

10. An apparatus as in claim 5 wherein the data bus is a serial bus.

11. A method for controlling filter selection, the method comprising:
    producing control data for controlling a frequency;
    using the control data to cause a frequency signal to be generated by a frequency synthesizer; and
    utilizing the control data to enable at least one filter from a plurality of filters; and filtering the frequency signal with at least one of said enabled filters,
    wherein the step of producing control data for controlling a frequency comprises producing, within a first unit, control data for controlling a frequency in a second unit,
    further comprising transmitting the control data from a first unit and accepting the control data within a second unit,
    wherein the step of transmitting the control data from a first unit further comprises coupling the control data to a data bus, and the step of accepting the control data within a second unit further comprises accepting the control data from the data bus in a second unit,
    wherein the step of coupling the control data to a data bus comprises coupling serial control data to a serial data bus.

12. A method for controlling filter selection, the method comprising:
    producing control data for controlling a frequency;
    using the control data to cause a frequency signal to be generated by a frequency synthesizer; and
    utilizing the control data to enable at least one filter from a plurality of filters; and filtering the frequency signal with at least one of said enabled filters,
    wherein the step of producing control data for controlling a frequency comprises producing, within a first unit, control data for controlling a frequency in a second unit,
    further comprising transmitting the control data from a first unit and accepting the control data within a second unit,
    wherein the step of transmitting the control data from a first unit further comprises coupling the control data to a data bus, and the step of accepting the control data within a second unit further comprises accepting the control data from the data bus in a second unit,
    wherein the step of producing, within a first unit, control data for controlling a frequency in a second unit comprises producing control data within a baseband unit of a portable communication unit for controlling a frequency in a frequency synthesizer in the portable communication unit.

13. A method for controlling filter selection, the method comprising:
    producing control data for controlling a frequency within a first unit;
    coupling the control data to a data bus;
    accepting the control data from the data bus in a second unit;
    using the control data to cause a frequency signal to be generated by a frequency synthesizer; and
    using the control data to disable at least one filter from a plurality of filters,
    wherein the step of coupling the control data to a data bus comprises coupling serial control data to a serial data bus.

14. A method for controlling filter selection, the method comprising:
    producing control data for controlling a frequency within a first unit;
    coupling the control data to a data bus;
    accepting the control data from the data bus in a second unit;
    using the control data to cause a frequency signal to be generated by a frequency synthesizer; and
    using the control data to disable at least one filter from a plurality of filters,
    wherein the step of accepting the control data from the data bus comprises accepting serial control data from a serial data bus.

15. A method for controlling filter selection, the method comprising:
    producing control data for controlling a frequency within a first unit;
    coupling the control data to a data bus;
    accepting the control data from the data bus in a second unit;

using the control data to cause a frequency signal to be generated by a frequency synthesizer; and using the control data to disable at least one filter from a plurality of filters, wherein the step of producing, within a first unit, control data for controlling a frequency in a second unit comprises producing control data within a baseband unit of a portable communication unit for controlling a frequency in a frequency synthesizer in the portable communication unit.

* * * * *

UNITED STATES PATENT AND TRADEMARK OFFICE
CERTIFICATE OF CORRECTION

PATENT NO.    : 6,631,273 B1         Page 1 of 1
DATED         : October 7, 2003
INVENTOR(S)   : Eswein et al.

It is certified that error appears in the above-identified patent and that said Letters Patent is hereby corrected as shown below:

<u>Title page, Item [54] and Column 1, line 2,</u>
Title, should read -- METHOD AND APPARATUS FOR FILTER SELECTION FROM FREQUENCY SYNTHESIZER DATA --.

Signed and Sealed this

Ninth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,631,273 B1  Page 1 of 1
DATED : September 9, 1999
INVENTOR(S) : Eswein et al.

It is certified that error appears in the above-identified patent and that said Letters Patent is hereby corrected as shown below:

Title page,
Item [54], Title, should read -- [54] METHOD AND APPARATUS FOR FILTER SELECTION FROM FREQUENCY SYNTHESIZER DATA --.
Item [73], Assignee, delete "[73] Assignee: Conexant Systems, Inc. Newport Beach, CA (US)"
and insert -- [73] Assignee: Skyworks Solutions, Inc., Irvine, CA (US) -- .

Signed and Sealed this

Eighth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,631,273 B1
DATED         : October 7, 2003
INVENTOR(S)   : Eswein et al.

It is certified that error appears in the above-identified patent and that said Letters Patent is hereby corrected as shown below:

Title page,
Item [22], Filed:, please delete "Jan. 31, 2000" and insert -- Sept. 9, 1999 --.
Item [74], *Attorney, Agent, or Firm*, please delete "Foley & Lardner" and insert -- Weide & Miller, Ltd. --

Signed and Sealed this

Twelfth Day of October, 2004

JON W. DUDAS
*Director of the United States Patent and Trademark Office*